United States Patent [19]
Koinuma et al.

[11] Patent Number: 5,369,336
[45] Date of Patent: Nov. 29, 1994

[54] PLASMA GENERATING DEVICE

[75] Inventors: Hideomi Koinuma; Shunpei Yamazaki, both of Tokyo; Shigenori Hayashi, Kanagawa, all of Japan

[73] Assignee: Semiconductor Energy Laboratory Co., Ltd., Kanagawa, Japan

[21] Appl. No.: 9,992

[22] Filed: Jan. 27, 1993

Related U.S. Application Data

[62] Division of Ser. No. 813,758, Dec. 30, 1991, Pat. No. 5,221,427.

[30] Foreign Application Priority Data

Dec. 31, 1990 [JP] Japan .................. 2-418695

[51] Int. Cl.$^5$ ............................................ H01J 7/24
[52] U.S. Cl. ......................... 315/111.21; 315/111.41; 315/111.81
[58] Field of Search .......... 315/111.21, 111.41, 315/111.81, 111.71; 313/231.31, 231.41; 250/426

[56] References Cited

U.S. PATENT DOCUMENTS

| | | | |
|---|---|---|---|
| 3,579,027 | 5/1971 | Pater | 315/111.41 |
| 4,341,616 | 7/1982 | Nagatomo et al. | 156/345 |
| 4,551,221 | 11/1985 | Axenor et al. | 204/298 |
| 4,596,030 | 6/1986 | Herziger et al. | 315/111.71 X |
| 4,912,731 | 3/1990 | Nardi | 315/111.21 X |
| 4,979,467 | 12/1990 | Kamoji et al. | 118/723 |
| 4,987,345 | 1/1991 | Stormberg et al. | 315/111.21 |
| 4,990,229 | 2/1991 | Campbell et al. | 315/111.41 X |
| 5,048,457 | 9/1991 | Hyman et al. | 118/723 |

FOREIGN PATENT DOCUMENTS 58-048422  3/1983  Japan .
59-094421  5/1984  Japan .

*Primary Examiner*—Robert J. Pascal
*Assistant Examiner*—Haissa Philogene
*Attorney, Agent, or Firm*—Sixbey, Friedman, Leedom & Ferguson

[57] ABSTRACT

A plasma generating device and a method for etching a minute region of a substrate under atmospheric pressure are disclosed. A gas containing helium as the main ingredient is glow discharged under atmospheric pressure, a halide is added to the discharge so as to activate the halogen element, and a solid material (substrate) such as silicon is chemically etched by using the radicals. At that time, a magnetic field acts on the discharge so as to draw out electrons and ions to the surface of the substrate, thereby increasing the radical density in the vicinity of the surface of the substrate and the etching rate.

13 Claims, 3 Drawing Sheets

F I G. 1
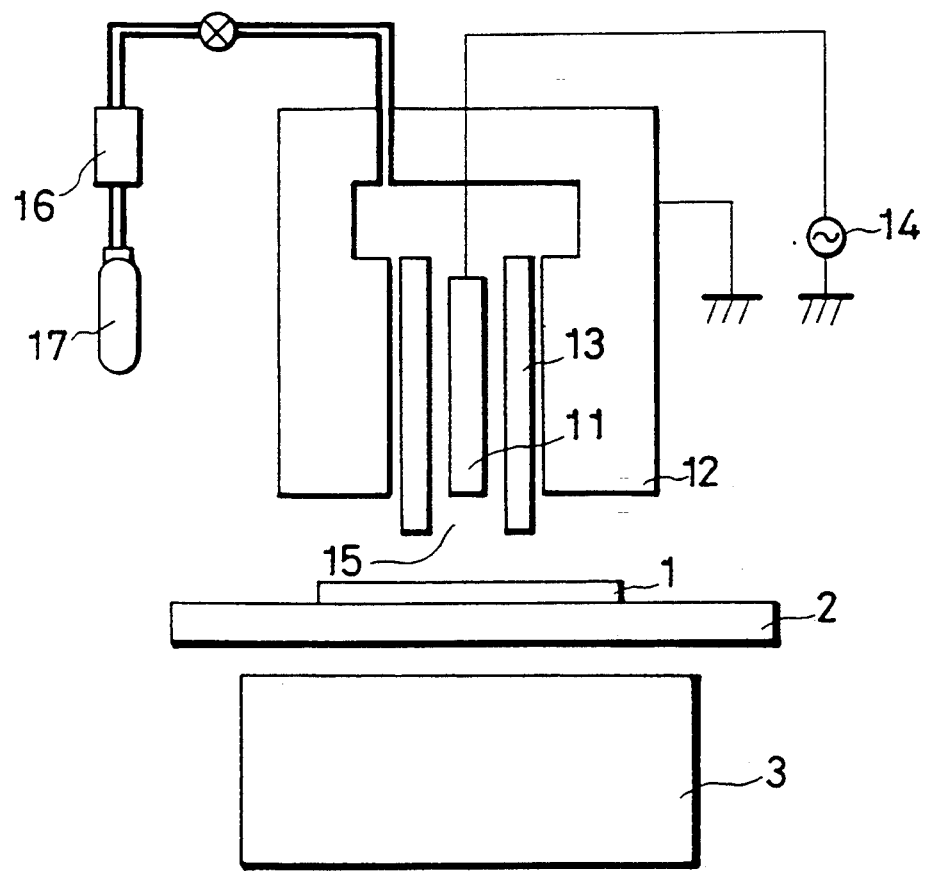

PLASMA GENERATING DEVICE

This is a Divisional application of Ser. No. 07/813,758, filed Dec. 30, 1991, now U.S. Pat. No. 5221427.

BACKGROUND OF THE INVENTION

1. Field of the Invention

The present invention relates to a plasma generating device which is capable of stably discharging under atmospheric pressure and producing low-temperature discharging plasma, and a method of plasma processing, particularly a method of etching a substrate without heating the substrate under atmospheric pressure by using such a plasma generator.

A plasma generating device of the present invention is also applicable to a fine processing by confining plasma in a minute region of a cylinder.

2. Description of the Prior Art

An atmospheric condition is an insulator in a low electric field, but when a high electric field such as direct current, alternating current and impulse is applied, a breakdown is caused, so that an electric current flows (self-maintaining discharge). The self-maintaining discharge is divided into a corona discharge, a glow discharge and an arc discharge. In a uniform electric field, the atmospheric condition entirely breaks down immediately after it shifts to a self-maintaining discharge, and then shifts to a glow discharge or an arc discharge. In contrast, in a nonuniform electric field, only a portion having a strong electric field first causes a breakdown and then a corona discharge is generated. Thereafter, when the electric field is further intensified, the discharge grows to an entire breakdown. In the atmosphere, when the discharge shifts to an entire breakdown, it generally tends to shift rapidly to an arc discharge without a process of a glow discharge. This is considered to be because although the characteristic feature of an arc discharge is a thermionic emission (existence of a cathode spot) due to an electrode heating caused by incident ions, since a larger number of ions enter the electrode under a high pressure than under a low pressure, the electrode is heated in a very short time, thereby causing a thermionic emission. Even if the electric current is not more than 2A, a glow discharge is sometimes used, but its controllability is not good, so that an arc discharge is preferably applied to welding, cutting or the like.

Since the arc discharge is applied to melting or fusing of a workpiece by using the high temperatures of the electrode and the positive column, the temperature of the portion processed rises as high as 2000 to 6000 K. It is therefore impossible to process a workpiece without heating.

In order to enable a surface treatment, surface processing at a room temperature, various attempts to stably generate a glow discharge under atmospheric pressure have been made (S. Kanazawa et.al. J. Phys.-D:Appl. Phys. 21(1988)838–840). The conditions which are necessary for generating a stable glow discharge under atmospheric pressure are (1) that the discharge space is filled with He, (2) that an insulator is inserted between the electrodes (in a discharge path), (3) that at least one of the electrodes has a shape of a needle or a brush, (4) and that the frequency of the electric field applied is not less than 3 kHz. The insulator is inserted so as to prevent the discharge from shifting to an arc discharge. The frequency of the electric field applied is set at not less than 3 kHz in order to make an electric current flow through the insulator. It is in order to make the initiation of discharge easier by making the electric field a nonuniform electric field that the electrode is caused to have a shape of a needle or a brush. Surface treatment such as etching of an organic matter such as polyimide or an inorganic matter such as silicon has also been made by utilizing these methods. These methods, however, have to go through a process of evacuating the reaction space and thereafter filling up the space with helium, although they are carried on under atmospheric pressure. Furthermore, these methods have a disadvantage in that the treatment must be uniformly carried on the substrate, so that it is impossible to selectively treat a minute region.

In order to solve the above-described problems, the present inventors invented a plasma generator and an etching method using the apparatus which is capable of processing, surface treatment and etching of a minute region without the need for a step of evacuating the reaction space by generating a stable low-temperature plasma and confining the plasma in the minute region. (Japanese Patent Application No. 286883/1990)

The method comprises the steps of concentrically providing electrodes which are composed of an electric conductor such as metal, inserting a cylindrical insulator in the gap between the electrodes in such a manner as to be concentric with the electrodes and to come into contact with the outer electrode, keeping a gas containing helium as the main ingredient flowing in the gap between the insulator and the center electrode under atmospheric pressure, applying an alternating electric field between the electrodes so as to ionize the gas containing helium as the main ingredient, thereby generating plasma in the gap between the insulator and the center electrode, and introducing an etching gas into the plasma.

Such plasma generated under atmospheric pressure, however, has a high probability of particle collision (that is, the mean free path is short) under this atmospheric pressure, so that the probability of electrons and ions recombining in the space also becomes high. As a result, plasma does not spatially extend and is rapidly canceled with the decrease of the potential gradient, so that only a few radicals reach the substrate. In order to prevent this, it is necessary to bring the substrate as close as possible to the discharge area, but since the radical density greatly changes even with a slight change of distance in the vicinity of the discharge area, the deterioration of its controllability remained a problem.

SUMMARY OF THE INVENTION

Accordingly, it is an object of the present invention to provide a plasma generating device which can eliminate the above-described problems in the prior art. To achieve this aim, the present invention provides a plasma generating device comprising: electrodes composed of an electric conductor such as a metal which are concentrically disposed; a cylindrical insulator which is inserted between the electrodes in such a manner as to be concentric with the electrodes and to come into contact with the outer electrode; and a magnet which is provided on the extension line of the axis of the concentric cylinder; wherein a reactive gas (a gas containig helium as the main ingredient) is kept flowing in the space between the insulator and the center electrode under atmospheric pressure, and an alternating electric field is applied between the electrodes so as to ionize the reactive gas (the gas containing helium as the main ingredient), thereby generating plasma under atmospheric pressure in the space. A magnetic field is established in the space for example in a direction parallel to the electrodes by the magnet.

The above and other objects, features and advantages of the present invention will become clear from the following description of the preferred embodiment thereof, taken in conjunction with the accompanying drawings.

BRIEF DESCRIPTION OF THE DRAWINGS

FIG. 1 schematically shows a plasma generating device according to the present invention;

DESCRIPTION OF THE PREFERRED EMBODIMENT

Figure 2:
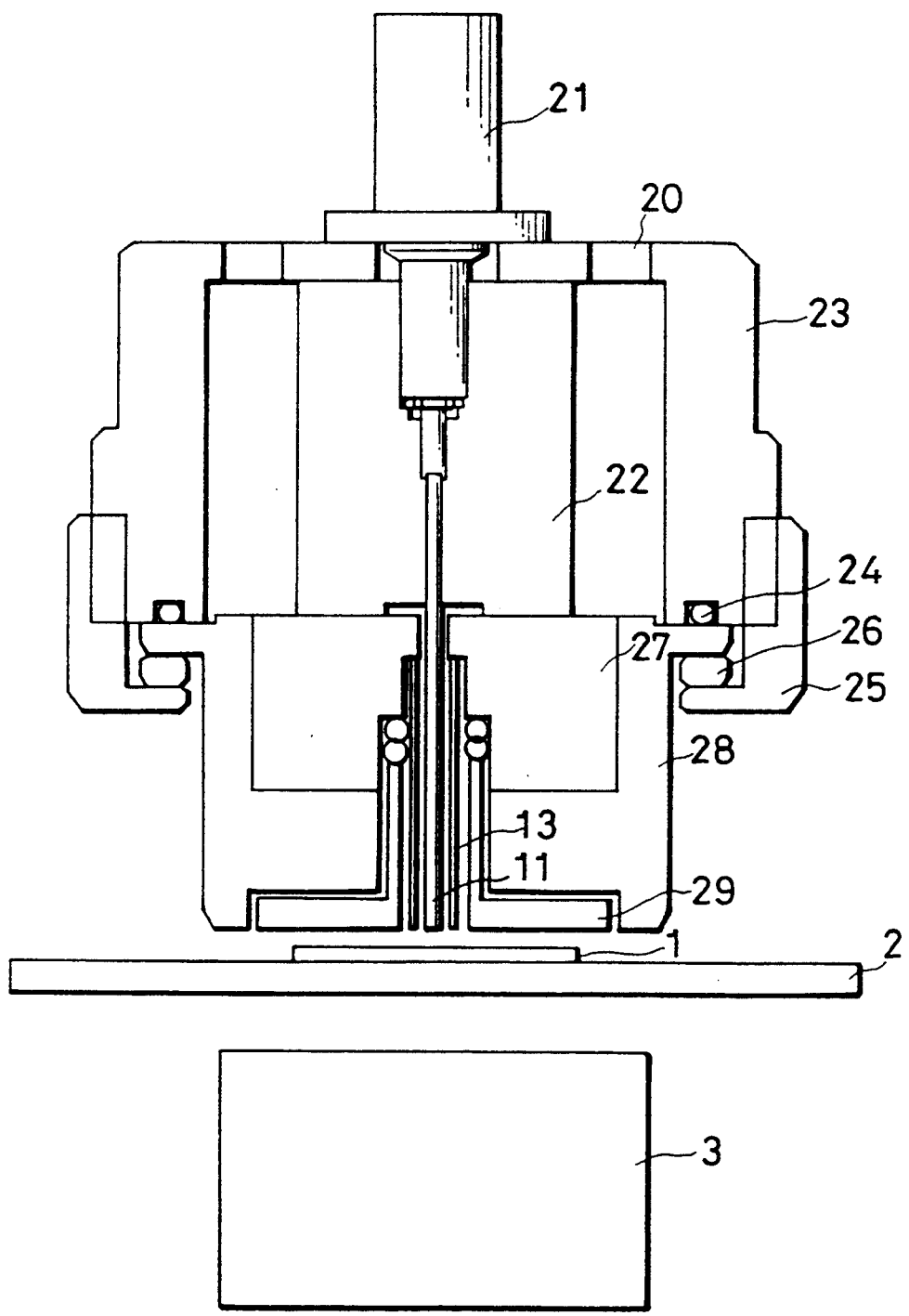
FIG. 2 shows an embodiment of a plasma generating device according to the present invention.

Electrons which exist in the discharge space start a cyclotron movement and drift along the magnetic flux. If the magnetic flux is approximately parallel to the axis of the concentric cylinder at this time, the electrons are drawn out in a direction parallel to the axis of the concentric cylinder. On the other hand, ions are dragged by the electrons by the coulomb force, and as a result, plasma extends in a direction of the axis of the concentric cylinder. Therefore, in the case of facing the substrate to be treated toward the opening of the concentric cylinder, plasma extends toward the substrate and the substrate is treated more effectively than in the case of not using a magnetic flux.

FIG. 1 schematically shows a plasma generating device of the present invention. A cylindrical insulator 13 is provided between a center conductor 11 and an outer conductor 12, and an alternating electric field is applied from an alternating power source 14 with the center conductor 11 and the cuter conductor 12 as the electrodes. A gas supply system comprising a bomb 17 and a flow rate controller 16 is connected with a discharging space 15. A gas containing helium as the main ingredient is supplied in a flowing state from the bomb 17 to the discharge space 15 through the flow rate controller 16. A substrate 1 to be etched is held by a paramagnetic substrate holder 2, and a magnet 3 is provided an the back side of the substrate holder 2. The upper side (the side of the substrate holder) of the magnetic pole is the S pole and the back side thereof is the N pole. By virtue of this magnet, the electrons in the discharge space 15 drift to the substrate side by a cyclotron movement and the ions also extend toward the substrate in such a manner as to be dragged by the electrons. The plasma therefore extends toward the substrate by virtue of this magnet, and as a result, the radical density on the surface of the substrate increases with the increase in the ion density and the etching rate also becomes higher.

Since the center conductor 11 is directly exposed to plasma, a metal such as tungsten and tantalum which has a high resistance to sputters is useful as the center conductor 11. In the case of adding to a gas containing helium a gas containing a halogen element such as fluorine and chlorine which hasf a strong etching action, it is preferable that the center conductor 11 is composed of a metal such as gold and platinum which is unlikely to be etched by a halogen element, or the surface thereof is coated with such a metal. It is to be desired that the outer diameter of the center conductor 11 and the inner diameter of the outer conductor 12 satisfy the following formula:

$$\frac{\text{(Inner diameter of an outer conductor)}}{\text{(Outer diameter of a center conductor)}} \geq 3$$

This is the condition (corona generating condition) for making a nonuniform electric field between the center conductor 11 and the outer conductor 12, which makes the initiation of discharging easier. The condition is only described as a desriable condition. That the ratio of the formula is less than 5 and close to 1 (actually, since the cylindrical insulator 13 is inserted between the center conductor 11 and the outer conductor 12, the value cannot be 1) only means that the discharge shifts to the glow discharge not through the corona discharge. It is to be understood that the present invention is not limited by the condition as long as a discharge is generated. (The present invention is applicable to corona discharge.)

The cylindrical insulator 13 is provided in order to prevent the discharge from shifting to an arc discharge between the electrodes. As an insulator, an inorganic material such as quartz glass and alumina and an organic material such as Teflon, polyimide, polyethylene and polyethylene terephthalate are usable. Since there is a possibility that the cylindrical insulator is exposed to the discharge and its temperature rises, quartz glass, alumina and the like which have a high heat resistance are effective. The higher the dieleotric constant of the insulator is, the more easily the discharge starts, because the electric voltage applied to the gap between the center conductor and the insulator becomes the higher. Alumina, soda glass and the like are therefore effective. Since the thickness of the cylindrical insulator changes in accordance with the specific dielectric constant of the insulator, and when the gap between the center conductor and the insulator is too wide, the voltage exceeds the practical output voltage of the alternating power source, the gap between the center conductor and the insulator and the specific dielectric constant of the insulator are set in the following range. That is, the gap between the insulator and the center electrode is not more than 5 mm, preferably not more than 1 mm, and the ratio of the thickness D (mm) and the specific dielectric constant S of the insulator is not more than 1 (i.e. $D/S \leq 1$), preferably not more than 0.2 (i.e. $D/S \leq 0.2$).

The lowest limit of the frequency of the alternating power source is determined by the capacitive susceptance generated by the insulator which is inserted in the discharge path. That is, the capacity C per unit length is expressed as follows by the capacity of the gap capacity Cg between the center conductor and the insulator and the insulator capacity Ci, which are synthesized in series:

$$Cg = \frac{2\pi\epsilon o}{\log(b/a)}, \ Ci = \frac{2\pi\epsilon}{\log(c/b)}$$

wherein a represents the radius of the center conductor, b the inner diameter of the insulator, c the inner diameter of the outer electrode, $\epsilon$ the dielectric constant of the insulator, and $\epsilon_0$ the dielectric constant of the vacuum.

The electric field which is applied between the concentric cylindrical electrodes is divided in the above-described ratio of Cg and Ci. It has been proved by experiments that when the susceptance value $\omega C$ by the insulator is not less than $10^{-6}$ [S], the discharge is stable. If it is assumed that a, b and c are 0.5, 0.85 and 1.25 mm, respectively, and the length of the coaxial cylinder is 13 mm and quartz is used as the insulator, and the specific dielectric constant is 3.8, Ci=13 pF, so that the frequency used is about more than 12 kHz.

It is necessary that a gas containing helium as the main ingredient which is supplied to the discharge space 15 contains not less than 70% of helium. As an additional gas, a gas containing halogen such as $CF_4$, $CCl_4$ and $NF_3$ are also used in addition to a rare gas such as Ne, Ar, Kr and Xe. The gas containing helium and the additional gas may be introduced into the discharging space at the same time. If a halogen containing gas is used, etching is possible. It has been proved from experiments that in the case of using Ar as the additional gas, when the Ar content is not less than 30%, the discharge does not occur, while in the case of using $CF_4$ as the additional gas, when the $CF_4$ content is not less than 4%, the discharge does not occur. Furthermore, if a hydrocarbon gas such as $CH_4$ and $C_2H_4$ is added, it is possible to form a carbon film. Although it is possible to form a silicon film by using $SiH_4$ and the like, this involves a high risk because the film is formed in an open state.

In addition to the above-described method in which a reaction gas is mixed with helium and then introduced into the discharge space, there is a method in which helium radicals are transported to a region to be reacted such as the surface of a substrate in a gas stream by taking advantage of the long life of metastable excited helium atom, and the reaction gas is supplied to the region through a nozzle or the like. Since ions do not reach the region to be reacted and only radicals are supplied thereto, no electric current flows into the reactant. It is therefore possible to use a living body as a reactant. That is, it is possible to pare a tooth or a nail by radicals or the radicals of the etching gas supplied, if necessary.

The plasma generating device of the present invention is capable of controlling the distance which radicals travel by controlling the flow rate of the gas supplied. If the inner diameter of the insulator is 0.85 mm, the flow velocity is about 500 mm/sec with a gas supply of 70 sccm. The flow rate of the gas supplied increases in proportion as the increase in the flow velocity, and the distance which radicals travel becomes longer by that degree. Not only a substrate outside of the discharge region but an electrode itself within the discharge space can be etched. Using this advantage, it is also possible to form an acicular material which has a very sharp point.

EXAMPLE 1

FIG. 2 is a sectional view of an embodiment of a plasma generating device of the present invention. The plasma generating device comprises a center columnar conductor (electrode) 11, a cylindrical insulator 13 and a peripheral cylindrical conductor (electrode) 29. The center columnar conductor 11, the cylindrical insulator 13 and the peripheral cylindrical conductor 29 are coaxially arranged with a discharging space formed between the center columnar conductor 11 and the cylindrical insulator 13. The discharging space is cylindrical in FIG. 2. In this embodiment, the center conductor 11 was made of stainless steel, the cylindrical insulator 13 was made of quartz glass and the peripheral conductor 29 was made of stainless steel. The center conductor 11 was connected to an MHV coaxial plug 21, and an alternating electric field was applied from an alternating power source through a coaxial cable (not shown) which was connected to the MHV coaxial plug 21. (The alternating power source is operatively connected with the center columnar electrode and the peripheral cylindrical electrode. A gas, e.g. helium, was supplied from a gas diffuser 20 and then introduced between the center conductor 11 and the cylindrical insulator 13 through the gap between Teflon insulators 22 and 27. The Teflan insulators 22 and 27 also have a role of preventing a discharge in unnecessary places. Boxbodies 23 and 28 were fixed by clamping metals 25 and 26. The boxbodies 23 and 28 and the clamping metals 25 and 26 were made of stainless steel and their potentials as well as that of the peripheral electrode 29 were maintained at the grounding potential. The gaps between parts are sealed by an O-ring 24 so that helium introduced does not leak. The gap between the cylindrical insulator 13 and the peripheral electrode 29 was filled with conductive metal foil (not shown) in order to electrically connect the cylindrical insulator 13 to the peripheral electrode 29. Silicon (100) was used for a substrate 1. As a substrate holder 2, paramagnetic Pyrex glass (1.1 mm in thickness) was used. As a magnet 3, a cylindrical permanent magnet was used, the substrate side thereof being the S pole. The cylindrical permanent magnet was provided on a straight extension line from axis of the center columnar conductor 11. The distance between the substrate 1 and the center conductor 11 was 2 mm. The distance between the center conductor 11 and the surface of the magnet 3 was 10 mm. The diameter of the center conductor 11 was 1 mm, the outer diameter of the insulator 2.5 mm, and the thickness of the insulator 0.4 mm. A discharge was generated in the region having a diameter of 1.7 mm.

Figure 3:
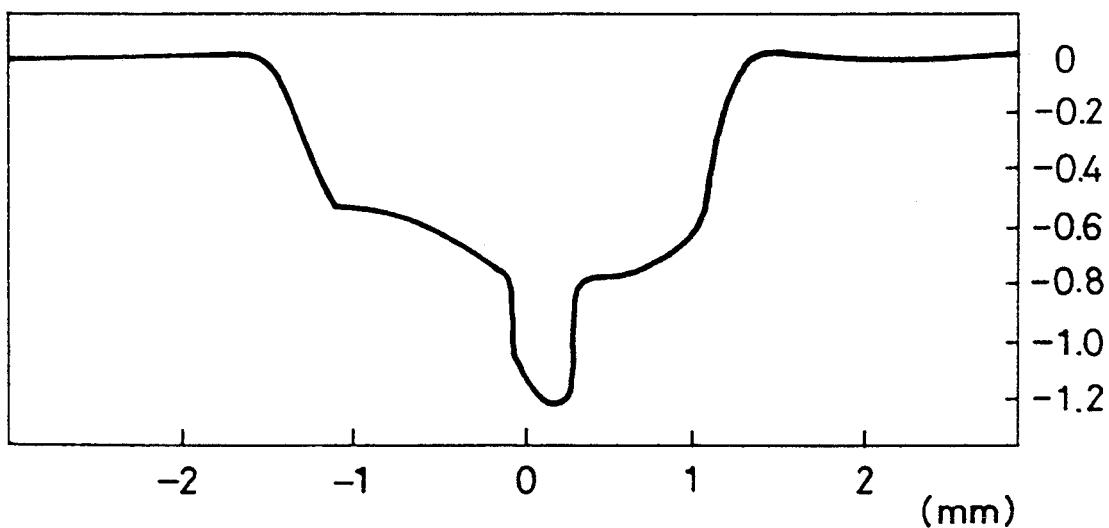
FIG. 3 is an etching profile of the surface of a silicon substrate by CF4/helium plasma, when a magnetic field is applied.

When helium and $CF_4$ were supplied to the above-described apparatus at a rate of 69.93 sccm and 0.07 sccm, respectively, and a high-frequency electric power of 70 W having a frequency of 13.56 MHz was applied, a stable discharge was obtained. This discharge was maintained for 5 minutes. FIG. 3 is a profile of the surface shape of the silicon wafer after etching. It is observed that the center is selectively etched by the effect of the magnetic field. The etching rate in the center portion was as high as 0.24 $\mu$m/min.

COMPARATIVE EXAMPLE

Figure 4:
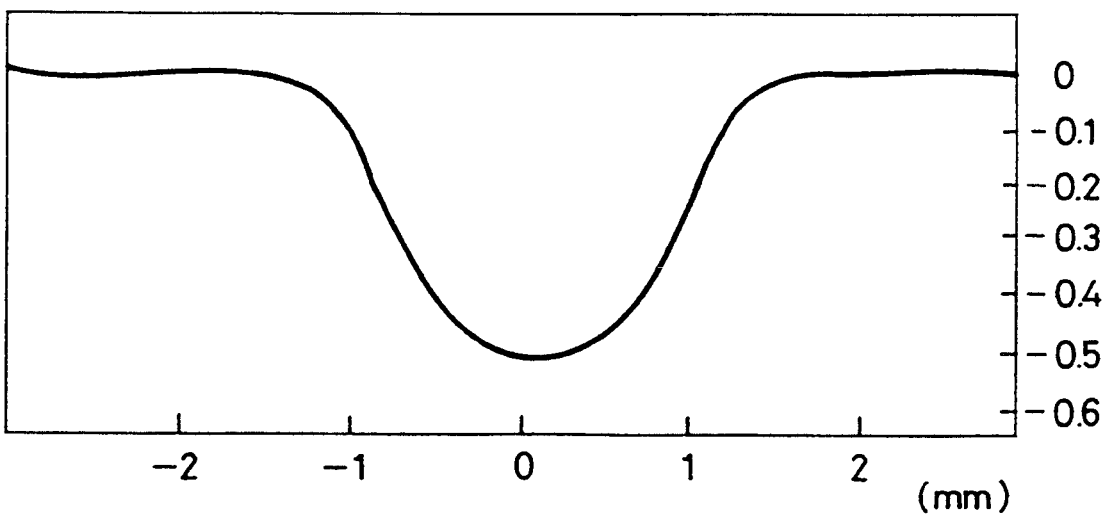
FIG. 4 is an etching profile of the surface of the silicon substrate by CF4/helium plasma, when no magnetic field is applied.

In this comparative example, no magnetic field was applied. The plasma generating device and the conditions for etching were the same as those in Example 1 except that the magnet 3 was not provided. FIG. 4 is a profile of the surface of the silicon after etching. No selective etching on the center portion as in Example 1 shown in FIG. 3 was seen and the etching rate in the center portion was as low as about 0.1 $\mu$m/min in comparison with that in Example 1.

As described above, by using the plasma generating device of the present invention having a magnetic field, it is possible to obtain a stable discharge in the atmosphere. It has been also confirmed that by further adding CF$_4$ to the helium gas, a stronger etching action is obtained.

While there has been described what is at present considered to be a preferred embodiment of the invention, it will be understood that various modifications may be made thereto, and it is intended that the appended claims cover such modifications as fall within the true spirit and scope of the invention.

What is claimed is:

1. A plasma generating device comprising:
   a central columnar electrode;
   a peripheral cylindrical electrode coaxially surrounding said central columnar electrode;
   an insulating cylinder coaxially interposed between said central columnar electrode and said peripheral cylindrical electrode with a discharging space formed between said central columnar electrode and said peripheral cylindrical electrode;
   an alternating current source operatively connected with said central columnar electrode and said peripheral cylindrical electrode in order to induce an alternating electric field therebetween;
   a gas supply system for supplying a gas into said discharging space; and
   a magnet provided on a straight extension line from axis of said central columnar electrode.

2. The plasma generating device as claimed in claim 1 wherein said discharging space is a cylindrical space closed at one end and opened at the other end.

3. The plasma generating device as claimed in claim 1 wherein a gap between said central columnar electrode and said insulating cylinder is no wider than 6 mm.

4. The plasma generating device as claimed in claim 1 wherein thickness D in unit of mm and specific dielectric constant S of said insulating cylinder satisfies $D/S \leq 1$.

5. The plasma generating device as claimed in claim 2 wherein said magnet is provided on an opposite side of a substrate to the other end.

6. The plasma generating device as claimed in claim 1 wherein said insulating cylinder is made of a material selected from the group consisting of Teflon, polyimide, polyethylene, polyethylene terephthalate, quartz glass and alumina.

7. The plasma generating device as claimed in claim 1 wherein said gas comprises helium.

8. The plasma generating device as claimed in claim 1 wherein said insulating cylinder is electrically connected to said peripheral cylindrical electrode.

9. The plasma generating device as is claimed in claim 2 wherein said opened end of the discharging space is at atmospheric pressure so that plasma is generated at atmospheric pressure.

10. A plasma processing device comprising:
    an inner electrode elongated in one direction;
    an outer electrode elongated in said one direction and surrounding said inner electrode, with a gap between said inner electrode and said outer electrode;
    an insulating body interposed between said inner electrode and said outer electrode;
    a discharge space formed between said inner electrode and said outer electrode with said insulating body therebetween;
    a means for introducing a gas into said discharge space at atmospheric pressure;
    a means for applying a voltage between said inner electrode and said outer electrode to produce a plasma of said gas in said discharge space;
    an object to be treated with said plasma, located adjacent to one end of said discharge space and on an extension of said elongated direction; and
    a means for inducing a magnetic field to cause said plasma to be directed toward said object.

11. The plasma processing device of claim 10 wherein said insulating body is provided in contact with an inner surface of said peripheral electrode.

12. The plasma processing device of claim 10 wherein said magnetic field is substantially parallel with the elongated direction of said electrodes.

13. The plasma processing device of claim 11 wherein a gap between said central electrode and an inner surface of said insulating body is not thicker than 5 mm.

* * * * *